(12) United States Patent
Morifuji

(10) Patent No.: US 6,175,157 B1
(45) Date of Patent: *Jan. 16, 2001

(54) SEMICONDUCTOR DEVICE PACKAGE FOR SUPPRESSING WARPING IN SEMICONDUCTOR CHIPS

(75) Inventor: Tadahiro Morifuji, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/045,135

(22) Filed: Mar. 20, 1998

(30) Foreign Application Priority Data

Mar. 21, 1997 (JP) .................................................. 9-068540

(51) Int. Cl.[7] ......................... H01L 23/48; H01L 23/52; H01L 23/40
(52) U.S. Cl. ..................... 257/777; 257/778; 257/685; 257/686; 257/789; 257/758; 257/737; 257/779; 257/770; 257/784; 438/108; 438/109
(58) Field of Search ...................... 257/685, 686, 257/777, 778, 737, 738, 779, 780, 784, 789; 438/108, 109

(56) References Cited

U.S. PATENT DOCUMENTS

| | | | |
|---|---|---|---|
| 4,764,804 | * | 8/1988 | Sahara et al. ........................... 357/81 |
| 5,120,665 | * | 6/1992 | Tsukagoshi et al. ...................... 437/8 |
| 5,376,825 | * | 12/1994 | Tukamoto et al. .................... 257/685 |
| 5,400,950 | * | 3/1995 | Myers et al. ...................... 228/180.22 |
| 5,523,628 | * | 6/1996 | Williams et al. ..................... 257/777 |
| 5,686,703 | * | 11/1997 | Yamaguchi ........................... 174/259 |
| 5,734,199 | * | 3/1998 | Kawakita et al. .................... 257/737 |
| 5,813,870 | * | 9/1998 | Gaynes et al. .......................... 439/91 |

FOREIGN PATENT DOCUMENTS

| | | | |
|---|---|---|---|
| 362150837 | * | 7/1987 | (JP) . |
| 401185952 | * | 7/1989 | (JP) . |
| 407050330 | * | 2/1995 | (JP) . |

* cited by examiner

*Primary Examiner*—Minh Loan Tran
*Assistant Examiner*—Luan Thai
(74) *Attorney, Agent, or Firm*—Hoffmann & Baron, LLP

(57) ABSTRACT

A semiconductor device includes a main chip and a sub-chip. The both chips are in a mount-structure, and molded by a resin package. The main chip has electrode pads formed at an periphery in a connecting surface thereof, while the sub-chip has a plurality of connecting bumps formed at a periphery in a connecting surface at positions corresponding to the plurality of electrode pads. A plurality of dummy bumps are formed at a central area of the connecting surface of the sub-chip. Connections are made respectively between the connecting bumps and the connecting electrodes. The main chip and the sub-chip have the connecting bumps and dummy bumps interposed therebetween to thereby prevent the main chip and/or the sub-chip from warping.

12 Claims, 4 Drawing Sheets

US 6,175,157 B1

SEMICONDUCTOR DEVICE PACKAGE FOR SUPPRESSING WARPING IN SEMICONDUCTOR CHIPS

BACKGROUND OF THE INVENTION

1. Field of the Invention

This invention relates to a semiconductor device having a plurality of semiconductor chips. More particularly, this invention relates to a semiconductor device having one semiconductor chip stacked thereon with another semiconductor chip so that they are connected together, thereby increasing the integration density.

2. Description of the Prior Art

There is one example of this kind of a conventional semiconductor device disclosed by Japanese Laying-Open Patent Publication No. H6-112402 [H01L25/065, 07, 18] assigned to the same assignee as this invention was assigned to. This prior art includes two IC chips each having bumps formed at a periphery of a connecting surface so that the two IC chips are connected together. These both IC chips are further transfer-molded into a mold or package.

In this prior art, however, the bumps are placed only at the periphery of the IC chip, involving a problem as stated below. That is, no bumps are provided at a central area of the IC chips so that a gap might occur between the central areas of the two IC chips. This results in warping in at least one of the two IC chips in a manner of nearing two IC chips together. Accordingly, there arises a problem that the circuit elements formed in the connection surface undergo damage due to nearing the two IC chips, besides the warped IC chip surface suffers from cracks. This tendency becomes prominent as the area of the IC chips increases.

SUMMARY OF THE INVENTION

Therefore, it is a primary object of this invention to provide a novel semiconductor device having a plurality of semiconductor chips.

It is another object of this invention to provide a semiconductor device that can prevent the semiconductor chip from warping.

It is further object of this invention to provide a semiconductor device having semiconductor chips and circuit elements prevented from being damaged.

A semiconductor device according to this invention, comprises: a first semiconductor chip having a first connecting surface; a second semiconductor chip placed over the first semiconductor chip and having a second connecting surface; a plurality of first bumps formed on at least one of the first connecting surface and the second connecting surface so as to connect between the first semiconductor chip and the second semiconductor chip; and at least one second bumps formed at least one of the first connecting surface and the second connecting surface.

The first bumps serve to connect between the first connecting surface and the second connecting surface, i.e., the first semiconductor chip and the second semiconductor chip. The second bumps are interposed, at an area other than that having the first bumps, between the first semiconductor chip and the second semiconductor chip. Therefore, even if a warp occurs in one or both of the first semiconductor chip and the second semiconductor chip, the deformation is suppressed to a minimum extent.

Therefore, according to this invention, it is possible to prevent the semiconductor chip from excessively warping so that there is no possibility of damaging to the semiconductor chip or circuit elements formed thereon.

Incidentally, the first bumps solely may be utilized to connect between the first semiconductor chip and the second semiconductor chip. Alternatively to this, both the first bumps and the second bumps may be used for the connection. Note that the first bump (and the second bump) serving to connect between chips is referred to as "connecting bump" while the second bump not serving to connect between the chips is referred to as "dummy bump" throughout this Specification.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
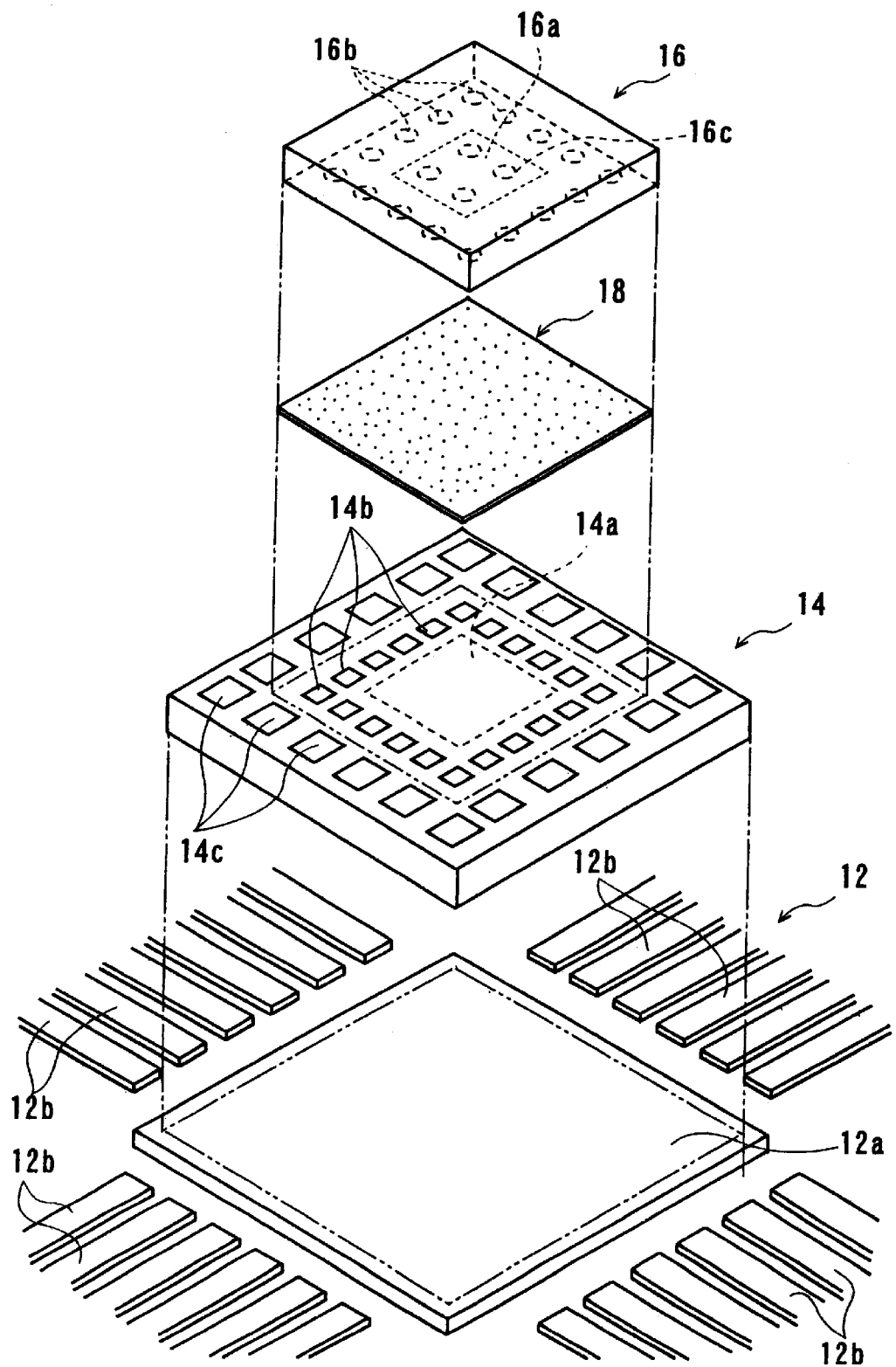
FIG. 1 is an exploded perspective view showing an essential part of one embodiment of this invention.
Figure 2:
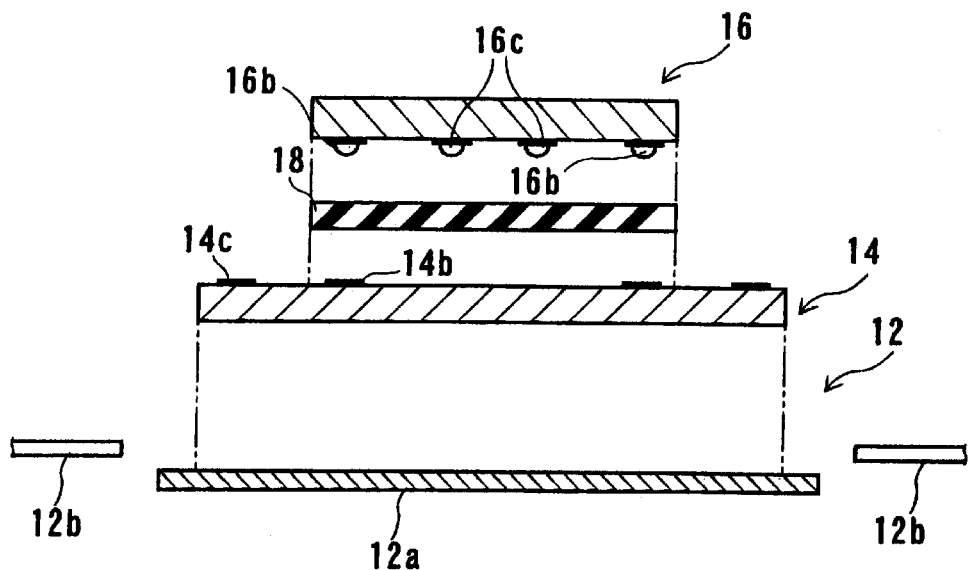
FIG. 2 is a sectional illustrative view of the FIG. 1 embodiment.
Figure 3:
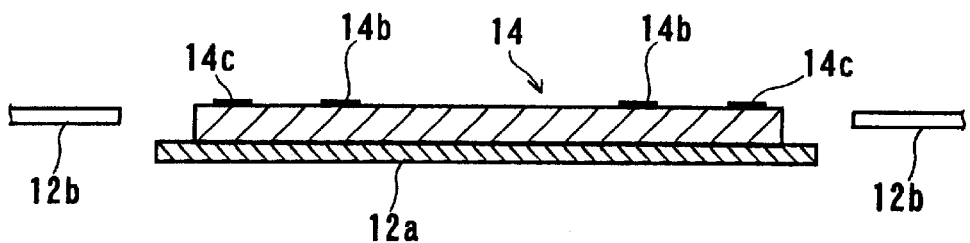
FIG. 3 is a sectional illustrative view showing a state that one IC chip is firmly fixed on a leadframe in the FIG. 1 embodiment.
Figure 4:
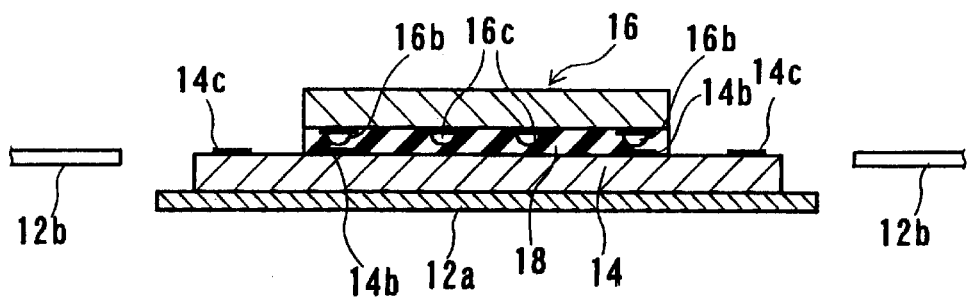
FIG. 4 is a sectional illustrative view showing that two IC chips are in connection with each other in the FIG. 1 embodiment.

Referring to FIG. 1 and FIG. 2, a semiconductor device 10 as an embodiment according to this invention includes a leadframe 12. The leadframe 12 has a chip-mounting base 12a arranged in a rectangular form at a center thereof. The leadframe 12 is provided with a plurality of lead terminals 12b in such a manner that they extend outward from each of four sides of this mounting base 12a. On a surface of the mounting base 12a, a main chip 14 is mounted by die-bonding.

The main chip 14 is formed with a plurality of circuit elements 14a, such as active elements and passive elements, at a center in a surface thereof. Surrounding the circuit elements 14a, a plurality of electrode pads 14b are formed for connection to a sub-chip 16. Further, a plurality of electrode pads 14c are formed at around the electrode pads 14b so that they can be wire-bonded to the lead terminals 12b. That is, the electrode pads 14b are arranged at an periphery of a connecting area of the main IC 14, while the electrode pads 14c are placed at a periphery of the main chip 14.

Figure 5:
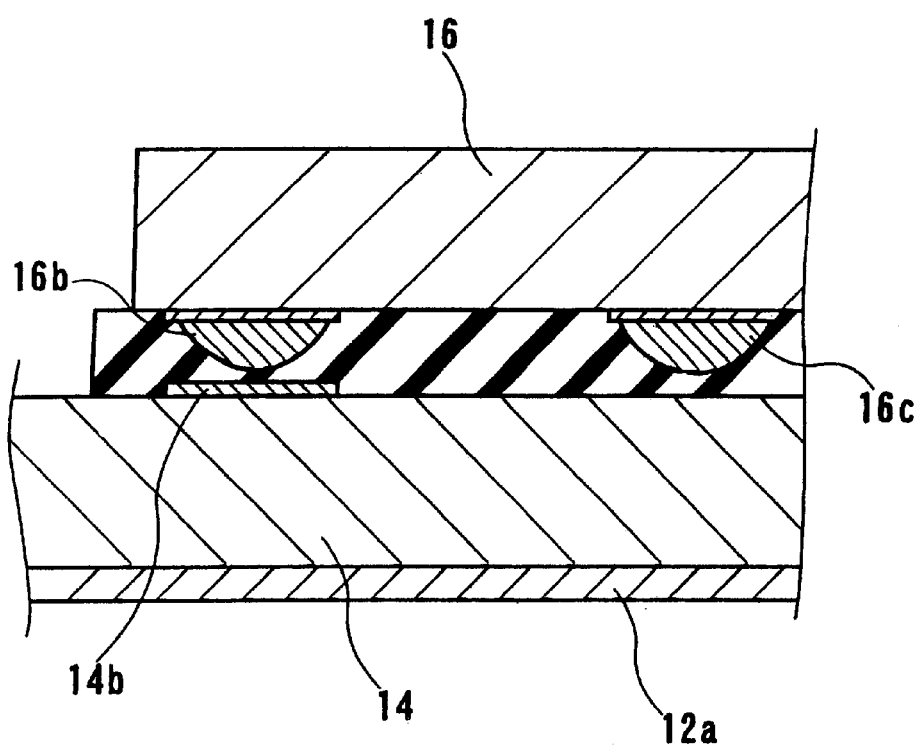
FIG. 5 is a sectional illustrative view showing by magnifying the essential part in the FIG. 1 embodiment.

The main chip 14 has the sub-chip 16 mounted thereon so that their surfaces face to each other. This sub-chip 16 also has, at a main surface, a plurality of circuit elements 16a, such as active elements and passive elements, similarly to the main chip 14. Surrounding the circuit elements 16a, a plurality of bumps 16b are formed for connection to the electrode pads 14b provided on the main chip 14. The sub-chip 16, in this embodiment, is smaller than the main chip 14, so that the main chip 14 is allowed to have an area corresponding to the entire area of the sub-chip 16, thus constituting the above-stated connecting area. Accordingly, the above-stated bumps 16b are arranged at a periphery of the IC chip 16 correspondingly in position to the electrode pads 14b. The bumps 16b are formed by plating or evaporating with solder (Pb-Sn), gold (Au), or the like so that they project toward the main surface or the connecting surface of the main chip 14, as will be particularly well understood in FIG. 5.

At least one dummy bumps 16c (four in this embodiment) are formed in a connecting surface of the sub-chip 16 at an area excepting the area having the bump 16b, specifically at a central area surrounded by the bumps 16b, by a process similar to that of the bumps 14b. These dummy bumps 16c are also formed in a manner projecting toward the main surface or connecting surface of the main chip 14. The dummy bump 16c has a projecting height, preferably, the same in amount as the projecting height of the bump 16b. However, the height of the dummy bump 16c may be formed different from the height of the connecting bump 16b. In such a case, the height of the dummy bump 16c would be lower than the height of the connecting bump 16b.

Further, the dummy bumps 16c in this embodiment were formed of a same material as that of the connecting bump 16b. However, the dummy bumps 16c and the connecting bumps 16b may be different in material. Specifically, the connecting bumps 16b should be formed of an electrically-conductive material, because it is to be connected to the electrode pad 14a. Contrary to this, the dummy bumps 16c can be formed not limited only to a conductive material but also an insulating material or a semiconductor material, because it is inherently not for a purpose of electrical connection. The dummy bumps 16c serve as spacers given between the main chip 14 and the sub-chip 16, it is possible to arbitrarily select a best suited material therefor in conformity to the functional requirement. For example, where the bumps 16b are formed of gold, the dummy bumps 16c can be formed of an inexpensive solder.

Also, in the embodiment the dummy bumps 16c were formed in the same size (diameter, height, etc) as the connecting bumps 16b. However, the dummy bumps 16c may be formed different in size and/or shape from the connecting bumps 16b. For example, it can be considered that the dummy bumps 16c be formed by far greater than a diameter of the connecting bump 16b. Also, the connecting bumps 16 were formed in circular in plan by taking account the connection to the electrode pad 14b through a connecting sheet 18 or anisotropic conductive sheet. Contrary to this, the dummy bumps 16c are not utilized for connection, and may be in an arbitrary form, such as rectangular, triangular, or the like, in plan. Further, the connecting bumps 16b were each formed as a projection with a round given at a tip in consideration of connection. However, the dummy bumps 16c may be formed in a flat face at the tip.

In this embodiment, a connecting sheet 18 is interposed between the main chip 14 and the sub-chip 16, as shown in FIG. 1 and FIG. 2. This connecting sheet 18 is for adhering between the main chip 14 and the sub-chip, to electrically connect the connecting bumps 16b and the electrode pads 14b therebetween. Consequently, the connecting sheet 18 is preferably formed by an anisotropic conductive sheet. The anisotropic conductive sheet is made by mixing conductive particles in an adhesive resin therefor. When the bumps 16b are strongly pressed onto the electrode pads 14b, the conductive particles existing therebetween are brought into a contact state. Due to this, the anisotropic conductive sheet 18 becomes exhibiting electrical conductivity only in a thickness direction.

As shown in FIG. 2, the sub-chip 16 is placed with its main surface, i.e. the surface formed with the circuit elements 16a and the bumps 16b, faced down. The sub-chip 16 is mounted on the main chip 14 through the connecting sheet 18 such that the bumps 16b on the sub-chip 16 respectively in abutment against the electrode pads 14b on the main chip 14. When the entire assembly is heated up while pressing the sub-chip 16 onto the main chip 14, the bumps 16b and the electrode pads 14b are brought into electric connection through the connecting sheet 18. At the same time, the adhesive resin of the connecting sheet 18 is hardened, thereby firmly fixing the sub-chip 16 on the main chip 14.

Further, wire bonding is made using thin metal wires 20 between the electrode pads 14c formed on the main chip 14 and the lead terminals 12b of the leadframe 12, thus providing electrical connection.

Figure 6:
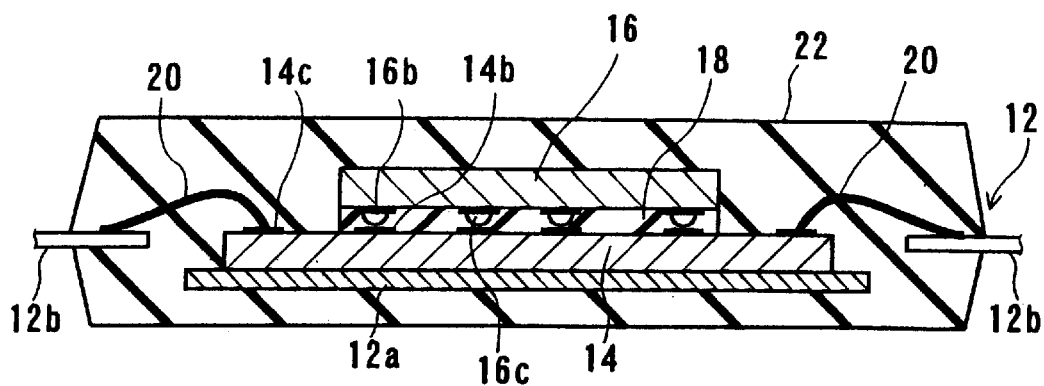
FIG. 6 is a sectional illustrative view showing the FIG. 1 embodiment.

Then, transfer-molding is carried out, as shown in FIG. 6, to form a synthetic-resin package 22 encapsulating the entire assembly. As shown in FIG. 6, the lead terminals 12b are cut out of the leadframe 12, and the lead terminals 12b are bent into a form flush with a backside of the package 22, thereby completing a semiconductor device 10.

During forming the package 22 or in a state of a complete semiconductor device 10, where an external force is applied to the main chip 14 and/or the sub-chip in a direction closing together the main chip 14 and sub-chip 16, if the dummy bumps 16c are absent, there is a possibility that the main chip 14 and/or the sub-chip 16 be deformed by warping. In the above embodiment, on the contrary, the bumps 16b and 16c, particularly the dummy bumps 16c, function as spacers present between the main chip 14 and the sub-chip 16. This serves to suppress the warp in the main chip 14 and/or the sub-chip 16 to a minimum degree.

Figure 7:
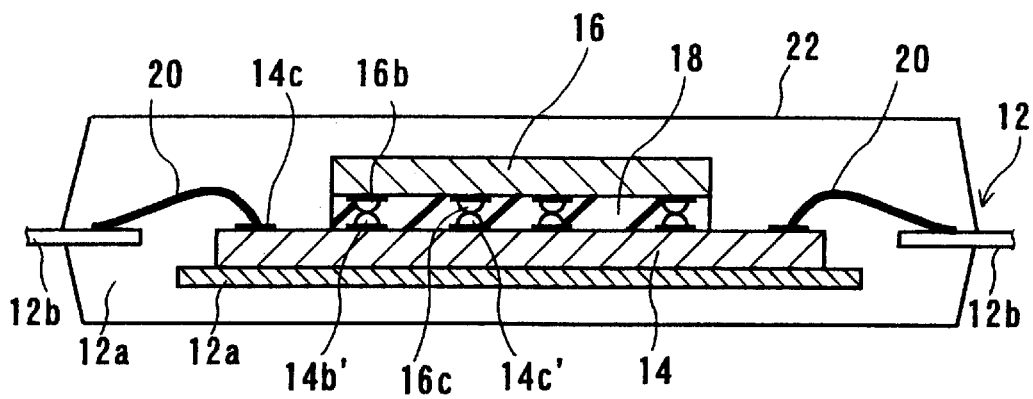
FIG. 7 is a sectional illustrative view showing another embodiment of this invention.

A semiconductor device 10 according to an embodiment as shown in FIG. 7 is similar to the semiconductor device 10 shown in FIG. 1 and FIG. 6, except for the following point. More specifically, the FIG. 6 embodiment has electrical connection between the main chip 14 and the sub-chip 16 by providing the electrode pads 14b on the former and the connecting pads 16b and the dummy bumps 16c on the latter. In the FIG. 7 embodiment, however, the main chip 14 has connecting bumps 14b' modified from the electrode pads 14b, and the dummy bumps 14c' formed at a central area of a connecting surface of the main chip 14 at position corresponding to the dummy bumps 16c of the sub-chips 16.

In this FIG. 6 embodiment, therefore, the main chips 14 and the sub-chip 16 are electrically connected through the connecting bumps 14b' and 16b, while the dummy bumps 14c' and 16c' function as spacers interposed between the two IC chips 14 and 16.

Incidentally, either one of the dummy bumps 14c' or 16c' may be provided by making modification to the FIG. 7 embodiment so that the height thereof is matched to a total height of the two connecting bumps 14b' and 16b.

Figure 8:
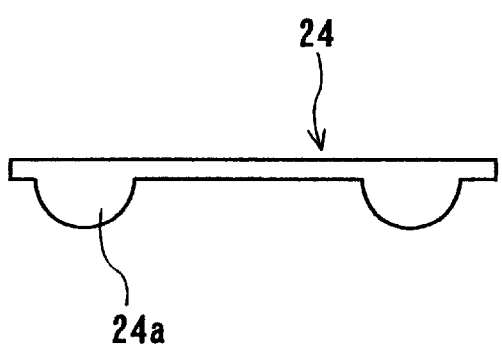
FIG. 8 is a sectional illustrative view showing one example of a dummy bump sheet.

In the above embodiment, the connecting bumps 16b (and 14b') and the dummy bumps 16c (and 14c') were formed through the common process. However, it is possible to form the connecting bumps 16b (and 14b') by a conventionally-known process and the dummy bumps 16c (and 14c') through a separate process therefrom. Specifically, a dummy bump sheet 24 as shown in FIG. 8 is utilized. That is, the dummy bump sheet 24 is made, for example, of a synthetic resin or metal to have an appropriate number of dummy bumps 24a on a surface thereof. Where this dummy bump sheet 24 is used, this dummy bump sheet 24 may merely be adhered onto a required area on a required chip in a process separate from that for the connecting bumps 16 (and 14b').

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first semiconductor chip having a first connecting surface;
   a second semiconductor chip arranged over said first semiconductor chip and having a second connecting surface;
   a plurality of connecting members formed on at least one of the first connecting surface and the second connecting surface;
   a plurality of connecting bumps formed on at least one of the first connecting surface and the second connecting surface, the connecting bumps being aligned with said connecting members so as to connect between said first semiconductor chip and said second semiconductor chip through pressure connection of said connecting bumps and said connecting members; and
   at least one first dummy bump formed on at least one of the first connecting surface and the second connecting surface for spacing said first semiconductor chip from said second semiconductor chip, said at least one first dummy bump being formed at a location where said connecting members are not formed, the at least one first dummy bump being surrounded by the plurality of connecting bumps within an area defined by the plurality of connecting bumps such that the plurality of connecting bumps are accessible from a periphery of at least one of the first connecting surface and the second connecting surface, the at least one first dummy bump being formed as a sheet.

2. A semiconductor device according to claim 1, further comprising an anisotropic conductive sheet interposed between the first connecting surface and the second connecting surface.

3. A semiconductor device according to claim 2, wherein said anisotropic conductive member includes an adhesive resin sheet containing electrically conductive particles mixed therein.

4. A semiconductor device according to claim 1, further comprising a package encapsulating said first semiconductor chip and said second semiconductor chip.

5. A semiconductor device according to claim 1, wherein said at least one first dummy bump is formed at a second area that is at least one area in the first connecting surface and the second connecting surface, excepting the area having said connecting bumps in the first area.

6. A semiconductor device according to claim 5, wherein said second area is within said first area.

7. A semiconductor device according to claim 6, wherein said second area is surrounded by said first area.

8. A semiconductor device according to claim 1, wherein said connecting members include electrode pads.

9. A semiconductor device according to claim 1, wherein said connecting members include at least one second connecting bump.

10. A semiconductor device according to claim 9, further comprising at least one second dummy bump formed on at least one of the first connecting surface and the second connecting surface at positions corresponding to said at least one first dummy bump, wherein said at least one second dummy bump functions as a spacer between said first semiconductor chip and said second semiconductor chip in cooperation with said at least one first dummy bump, wherein said plurality of connecting bumps and said at least one second dummy bump are formed by a substantially similar process, and wherein said plurality of connecting bumps and said at least one second dummy bump are formed in a substantially similar shape.

11. A semiconductor device according to claim 1, wherein said at least one first dummy bump is formed at a central area of at least one of the first connecting surface and the second connecting surface.

12. A semiconductor device, comprising:
    a first semiconductor chip having a first connecting surface;
    a second semiconductor chip arranged over the first semiconductor chip and having a second connecting surface;
    a plurality of connecting members formed substantially along a periphery of at least one of the first connecting surface and the second connecting surface;
    a plurality of connecting bumps formed substantially along a periphery of at least one of the first connecting surface and the second connecting surface, the connecting bumps being aligned with and corresponding to the connecting members; and
    at least one dummy bump formed at a central area inward of the periphery of at least one of the first connecting surface and the second connecting surface, the at least one dummy bump being surrounded by the plurality of connecting bumps within an area defined by the plurality of connecting bumps such that the plurality of connecting bumps are accessible from the periphery of at least one of the first connecting surface and the second connecting surface, the at least one dummy bump being formed as a sheet, the at least one dummy bump spacing the first semiconductor chip from the second semiconductor chip and suppressing warping of at least one of the first and second semiconductor chips.

* * * * *